(12) United States Patent
Hegermann et al.

(10) Patent No.: US 9,376,749 B2
(45) Date of Patent: Jun. 28, 2016

(54) METHOD FOR THE CHEMICAL VAPOR INFILTRATION OF REFRACTIVE SUBSTANCES

(71) Applicant: CVT GmbH & Co. KG, Halblech (DE)

(72) Inventors: Rainer Hegermann, Füssen/Hopfen (DE); Philipp Goetz, Halblech (DE)

(73) Assignee: CVT GMBH & CO. KG, Halblech (DE)

( * ) Notice: Subject to any disclaimer, the term of this patent is extended or adjusted under 35 U.S.C. 154(b) by 0 days.

(21) Appl. No.: 14/368,472

(22) PCT Filed: Jan. 9, 2013

(86) PCT No.: PCT/EP2013/050323
§ 371 (c)(1),
(2) Date: Jun. 24, 2014

(87) PCT Pub. No.: WO2013/104685
PCT Pub. Date: Jul. 18, 2013

(65) Prior Publication Data
US 2014/0356534 A1 Dec. 4, 2014

(30) Foreign Application Priority Data
Jan. 10, 2012 (DE) .......................... 10 2012 100 176

(51) Int. Cl.
*C23C 16/00* (2006.01)
*C23C 16/26* (2006.01)
(Continued)

(52) U.S. Cl.
CPC ................ *C23C 16/26* (2013.01); *C23C 16/32* (2013.01); *C23C 16/325* (2013.01); *C23C 16/34* (2013.01);
(Continued)

(58) Field of Classification Search
CPC .... C23C 16/045; C23C 16/26; C23C 16/458; C23C 16/455; C23C 16/32

USPC .............. 427/249.2, 255.12, 255.7, 900
See application file for complete search history.

(56) References Cited

U.S. PATENT DOCUMENTS

| 5,217,755 A | 6/1993 | Thebault et al. |
| 5,300,322 A | 4/1994 | Lowden |

(Continued)

FOREIGN PATENT DOCUMENTS

| DE | 3922539 A1 | 1/1991 |
| DE | 4142261 A1 | 6/1993 |

(Continued)

OTHER PUBLICATIONS

International Search Report for International Application PCT/DE97/02597 dated Apr. 9, 1998.
(Continued)

*Primary Examiner* — Kelly M Gambetta
(74) *Attorney, Agent, or Firm* — Shapiro, Gabor and Rosenberger, PLLC

(57) ABSTRACT

Method for chemical vapor infiltration of refractory substances, wherein a porous structure is subjected in a reaction zone to the flow of a gas containing at least one gaseous precursor, wherein the partial pressure of the precursor and the dwell time of the gas are set at a given temperature in such a manner that a deposition reaction of the precursor occurs in the porous structure in the partial pressure range of the saturation adsorption and the reaction of the precursor is limited in each stage of the infiltration in such a manner that during the flow through the reaction zone no more than 50% of the precursor are deposited as a solid phase in the porous structure, and the exposure of the porous structure to the flow occurs in a stack of superimposed layers through ring-shaped vertical circumferential gaps (A, B) as well as through transverse gaps (C) which are open towards the circumferential gaps (A, B). The outer circumferential gap (A) is open both towards the inlet side and towards the outlet side of the reaction zone, while the inner circumferential gap (B) is closed towards the inlet side and towards the outlet side and has a gap width that is greater than the outer gap (A).

42 Claims, 3 Drawing Sheets

(51) Int. Cl.
   *C23C 16/32*  (2006.01)
   *C23C 16/34*  (2006.01)
   *C23C 16/455* (2006.01)

(52) U.S. Cl.
   CPC ......... *C23C 16/345* (2013.01); *C23C 16/45502* (2013.01); *C23C 16/45563* (2013.01); *C23C 16/45591* (2013.01); *C23C 16/45593* (2013.01)

(56) References Cited

U.S. PATENT DOCUMENTS

| | | | |
|---|---|---|---|
| 5,348,774 A * | 9/1994 | Golecki | C04B 35/521 177/245 |
| 5,350,545 A | 9/1994 | Streckert et al. | |
| 5,411,763 A | 5/1995 | Weaver et al. | |
| 5,480,678 A | 1/1996 | Rudolph et al. | |
| 5,545,435 A | 8/1996 | Steffier | |
| 5,558,907 A | 9/1996 | Steffier | |
| 5,652,030 A | 7/1997 | Delperier et al. | |
| 5,738,908 A | 4/1998 | Rey et al. | |
| 5,744,075 A | 4/1998 | Klett et al. | |
| 5,904,957 A * | 5/1999 | Christin et al. | 427/248.1 |
| 5,916,633 A | 6/1999 | Lackey et al. | |
| 6,001,419 A * | 12/1999 | Leluan | C04B 35/806 427/249.2 |
| 6,197,374 B1 | 3/2001 | Huttinger et al. | |
| 6,669,988 B2 * | 12/2003 | Daws et al. | 427/249.2 |
| 8,084,079 B2 * | 12/2011 | Thebault et al. | 427/8 |
| 2004/0071877 A1 * | 4/2004 | Goujard et al. | 427/255.28 |
| 2007/0014990 A1 * | 1/2007 | Arico et al. | 428/408 |

FOREIGN PATENT DOCUMENTS

| | | |
|---|---|---|
| DE | 69603593 T2 | 2/2000 |
| EP | 0946459 A1 | 10/1999 |
| EP | 1936006 A2 | 6/2008 |
| JP | 082976 A | 1/1996 |
| WO | WO 9511868 A1 | 5/1995 |
| WO | WO 9516803 | 6/1995 |
| WO | WO 9523155 | 8/1995 |
| WO | WO 9632360 A1 | 10/1996 |

OTHER PUBLICATIONS

Office Action issued Jun. 3, 2008, in Japanese Patent Application 10-522030.

Office Action issued Jul. 18, 2012, in German Patent Application 102012100176.6.

International Preliminary Report on Patentability and/or Written Opinion for underlying International Application PCT/EP2013/050323.

* cited by examiner

METHOD FOR THE CHEMICAL VAPOR INFILTRATION OF REFRACTIVE SUBSTANCES

FIELD OF THE INVENTION

The invention relates to a method for chemical vapor infiltration of refractory substances, preferably of carbon, silicon carbide, boron nitride, titanium carbide and the like. The invention further relates to a device for carrying out the method according to the invention and to an infiltrated composite material produced by means of the method according to the invention.

The invention is based on a method for chemical vapor infiltration described in EP 0 946 459 B1. The partial pressure of the at least one gaseous precursor and the dwell time of the gas in the reaction zone are set at a given temperature in the reaction zone so that a deposition reaction of the precursor occurs in the porous structure in the range of partial pressure of the saturation adsorption, and so that the reaction of the gaseous precursor is limited in each stage of the infiltration in such a way that no more than 50%, for example 10% to 25% of the gaseous precursor fed in the gas are deposited as a solid phase in the porous structure when flowing through the reaction zone. Thereby, it is possible to operate with substantially higher pressures and partial pressures of the educt gases, for example in the range of 15 kPa to 25 kPa, in favor of high deposition speeds with high pore filling degrees, than would be the case in other known methods proceeding in an isothermal and isobaric way. According to EP 0 946 459 B1, the porous structure is subjected to a flow through vertical gaps having equal gap widths. In this connection, however, it cannot be ensured at all times that the refractory substance is deposited in a continuously homogeneous way and with a controllable target density.

BACKGROUND OF THE INVENTION

A chemical vapor infiltration method for densifying porous substrates disposed in ring-shaped stacks is known from WO 96/33295. In order to achieve dwell times of the vapor phase which are as short as possible, the vapor phase is introduced on the inlet side of the reaction zone into the central interior space of the stack of ring-shaped disks, and is discharged on the outlet side of the reaction zone from the outer circumferential space surrounding the stack on the outside. The outer circumferential space is closed toward the inlet side, and the central interior space is closed toward the outlet side. Thereby, the transverse slots formed between the disks inevitably join the flow path between the inlet and the outlet of the reaction zone. The infiltration is carried out at a temperature of typically 1,000° C. and at a low pressure of typically 1 kPa. However, this known method cannot be used in methods of the type according to the invention, where substantially higher pressures are applied, due to a significant vapor phase nucleation, such as soot production in case of carbon infiltration.

BRIEF OF DESCRIPTION OF THE INVENTION

A method for chemical vapor infiltration of refractory substances can be provided by the invention, which allows an improved homogeneity of the refractory substance deposited in the porous structure. In addition, the method according to the invention allows to set a desired deposition density (target density) of the deposited refractory substance.

According to the invention, a method is provided, wherein, for chemical vapor infiltration—also referred to as CVI method—, at least one porous structure (hereinafter also referred to as sample body or substrate) is subjected in a reaction zone to the flow of a gas containing at least one gaseous precursor of at least one refractory substance. The partial pressure of the gaseous precursor and the dwell time of the gas in the reaction zone are set at a given temperature in the reaction zone so that a deposition reaction of the gaseous precursor occurs in the porous structure in the range of partial pressure of the saturation adsorption. In this context, saturation adsorption means that the deposition speed remains substantially constant or rather is increased in an insignificant way when the partial pressure of the at least one gaseous precursor is increased. The reaction of the gaseous precursor is limited in each stage of the infiltration in such a way that no more than 50%, for example 10% to 25% of the precursor fed in the gas, forming a solid phase after the infiltration, are deposited as the solid phase in the porous structure as the gas flows through the reaction zone.

The porous structure is subjected to the flow in at least one vertical stack of superimposed and spaced-apart ring-shaped layers, the stack being arranged in a vertical direction between an inlet side and an outlet side of the reaction zone, the flow occurring through vertical circumferential gaps (A, B) of at least one radially outer circumferential gap (A) which is ring-shaped in the horizontal cross-section (in cross-section through the reaction zone) and of at least one radially inner circumferential gap (B) which is also ring-shaped in the horizontal cross-section (in cross-section through the reaction zone), as well as through transverse gaps (C) extending transverse to the vertical direction between the layers and through end gaps extending in a transverse direction between the inlet side and the outlet side, respectively, of the reaction zone and the respective end layer of the stack. The transverse gaps and the end gaps extending in a transverse direction are each open toward the radially outer circumferential gap as well as toward the radially inner circumferential gap.

Furthermore, according to the invention, the radially outer circumferential gap is open in its longitudinal direction which preferably conforms to the vertical direction towards the inlet side and toward the outlet side of the reaction zone whereas the radially inner circumferential gap is closed in its longitudinal direction which preferably conforms to the vertical direction both towards the inlet side and advantageously towards the outlet side. In this respect, the ratio of the gap width of the radially inner circumferential gap (B) to the gap width of the radially outer circumferential gap (A) is greater than 1 and equal to or less than 20, and the ratio of the gap width of each of the transverse gaps (C) to the gap width of the radially outer circumferential gap is 0.25 to 12.

Variations may occur within this gap width ratio, the gap width of the radially inner circumferential gap (B) being preferably always greater than the gap width of each of the transverse gaps. Preferably, the ratios of the gap width of the radially inner circumferential gap (B) to the gap width of the radially outer circumferential gap (A) and of the gap width of the transverse gaps (C) to the gap width of the radially outer circumferential gap (A) are chosen such that the ratio of the gap width of the radially inner circumferential gap (B) to the gap width of each of the transverse gaps (C) is in the range between 1 and 10, preferably between 1 and 5. If the ratio of the outer diameter of the ring-shaped layers of the stack to their inner diameter increases, the gap width ratio (B) to (C) for example decreases while the gap width ratio (B) to (A) remains unchanged.

A total gap ratio A:B:C is, for example, 1:2:0.5 to 1:10:5.

According to the invention, it is possible to operate at a comparably high pressure in the range of preferably 100 mbar to 300 mbar, with a comparably short dwell time of the gas of preferably 0.01 s to 0.9 s when passing through the reaction zone, and with a comparably short infiltration period for the deposition of the refractory substance in a predetermined density, while avoiding vapor phase nucleation to the greatest possible extent. By the size of the gap width of the radially inner circumferential gap relative to the gap width of the radially outer gap width, by which the stack is defined on its outer circumference, the free passage of the gas is driven from the radially outer circumferential gap through the transverse gaps all the way into the radially inner circumferential gap by which the stack is limited along its inner circumference and the inlet side end of which is closed. The deposition density for the deposition of the refractory substance in the pores of the porous structure in the respectively neighboring layers of the stack per infiltration cycle is determined by the size of the gap width of the transverse gaps relative to the gap width of the radially outer circumferential gap, so that this deposition density can be set by a corresponding dimensioning of the size of the gap width of the transverse gaps to a desired, to the greatest possible extent homogeneous target density per passage of the gas through the reaction zone. When the gap width ratio (B) to (A) remains unchanged, the preferred gap width ratio (B) to (C) decreases the smaller the aspired homogeneous deposition target density. The morphology of the deposited substance can be influenced by the size of the gap width of the transverse gaps as well.

The radially outer circumferential gap as well as the radially inner circumferential gap are each ring-shaped in cross-section at their locations between the transverse gaps and each have, across their length between the transverse gaps, a gap width that is constant in the circumferential direction of the respective circumferential gap. For example, the gap widths of the circumferential gaps are respectively constant in a vertical direction along the inner side and the outer side of the stack, respectively, even though it is also possible within the range of the invention of the ratio of the gap width of the radially inner circumferential gap to that of the radially outer circumferential gap to increase or to decrease the gap width of the radially inner circumferential gap and/or the gap width of the radially outer circumferential gap in a vertical direction from one transverse gap to the other one least along the end portion of the circumferential gap, in order to influence the deposition success.

The radially inner circumferential gap is limited at its outer circumference by the radially inner sides of the layers of the stack, and is limited by a reactor wall at its inner circumference, especially by a central core axially inserted in the stack. The radially outer circumferential gap is limited at its inner circumference by the radially outer sides of the layers of the stack and is defined by a reactor wall at its outer circumference. If therefore several layer stacks are subjected to a flow next to each other in a joint reactor vessel, each of the stacks is limited by an associated separate reactor wall in such a manner that the gap width of the radially outer circumferential gap is constant in a circumferential direction.

Also the transverse gaps (C) which are defined at the top and at the bottom by the layers of the stack respectively succeeding each other in the stack have a gap width that is constant in a circumferential direction along the respective radius. Here, they may also have gap widths which are preferably constant in a radial direction and equal to each other. It may, however, also be advantageous that the gap widths of the transverse gaps (C) in the reactor are different within the range of the ratio of the gap width of the transverse gaps to that of the radially outer circumferential gap according to the invention.

The method according to the invention is preferably applied to porous structures which are configured as ring disks forming the respective layer, which are preferably even and have equal outer and inner diameters, and are stacked one upon the other in the reaction zone, axially and concentrically to each other and at a distance from each other, the transverse gaps (C) being respectively formed between neighboring layers perpendicular to the axis of the disk stack.

Sample bodies which are not rotationally symmetric may, for example, be arranged in the respective layer in a corresponding ring disk form and with spacers provided therebetween.

The gap width of the radially inner circumferential gap relative to the gap width of the radially outer circumferential gap depends on the diameter of the layers of the stack. For example, a ratio range of the gap widths of the inner circumferential gap to the outer circumferential gap of 2 to 5 may be provided. The size of the gap width of the radially outer circumferential gap is chosen to be so small that the branch flows through the transverse gaps are generated across the entire stack height without the gas flow passing the transverse gaps, especially in the upper stack area, without substantial branches. A maximum gap width of the radially outer circumferential gap in the range of 8 mm has turned out to be advantageous for a preferred pressure range of 100 mbar to 300 mbar within the process conditions according to the invention. In case of smaller pressures, for example in the range of 75 mbar, a gap width that is greater than 8 mm should be assumed.

The gap width of the transverse gaps relative to the gap width of the radially outer circumferential gap depends, as already described, on the desired target density of the depositions, but also on the diameter of the layers of the stack. A range of at least and, preferably, 0.5 to 5 is considered as being the preferred range of the ratio of the gap width of each of the transverse gaps (C) to the gap width of the radially outer circumferential gap (A).

The gas from the radially inner circumferential gap (B) may also flow out of the reaction zone through the outlet side end gap at the outlet side end of the radially outer circumferential gap. The transverse outlet side end gap might also be open directly toward the outlet side of the reaction zone along at least a section of its radial extent. However, it is preferred that the outlet side end gap is closed in its longitudinal direction toward the outlet side of the reaction zone, for example by the basis of an outlet baffle cone, so that also the outer side of the outlet side end layer of the stack is subjected mainly to a flow of the gas from the radially inner circumferential gap without having a vapor phase nucleation at the outlet side end of the radially inner circumferential gap. The gap width of the outlet side end gap is, for example, chosen to be greater, advantageously up to 1.5 to 2.5 times greater than the gap width of the transverse gaps.

Preferably, the reaction gas is supplied to the radially outer circumferential gap through an inlet ring gap with a preferably constant gap width with a diameter that increases from a central gas inlet toward the radially outer circumferential gap. For this purpose, a baffle cone may be provided between the central inlet into the reactor and the inlet side axial front face of the sample body stack, the diameter of which increases in an axial direction of the stack towards the reaction space receiving the stack, and is surrounded by the inlet ring gap with a gap width which, for example, corresponds at most to the gap width of the radially outer circumferential gap between the lateral surface of the baffle cone and a correspondingly hollow cone-shaped portion of the reactor wall. The radially inner circumferential gap may be closed by the base of the baffle cone, just like the inlet side end gap, the gap width of which, for example, corresponds to the gap width of the transverse gaps, may be defined by this base. The gas flowing into the radially outer circumferential gap is preheated, for example in front of and/or in the inlet ring gap, namely by heating the inlet baffle cone.

On the other axial front face of the stack, an outlet ring gap is kept free in particular within a flow-guiding hollow cone-shaped portion of the reactor wall, the diameter of the outlet ring gap decreasing from the radially outer circumferential gap that opens thereinto, toward a central outlet. The outlet ring gap preferably also has a gap width that corresponds to the gap width of the radially outer circumferential gap, which may, however, even be greater than the gap width of the circumferential gap. The outlet ring gap may also be defined by a baffle cone on its radially inner side, by the base of which the radially inner circumferential gap is closed and the outlet side end gap is defined on its side that is turned away from the stack.

The method according to the invention may, for example, be applied to the chemical vapor infiltration of, for example, gaseous educts containing carbon, and other refractory compounds, such as SiC, BN, TiN, TiC.

The method according to the invention is preferably applied to a chemical vapor infiltration of carbon in porous sample bodies, for example so-called fiber or sintering material, by reacting methane ($CH_4$). For example, the methane is reacted by 10% to 30%, preferably by 20% at a temperature range of 900° C. to 1,200° C. at a pressure of 50 mbar to 300 mbar and with a dwell time in the reaction zone per passage of 0.01 s to 1 s. Due to the fact that an excessive quantity of methane is thereby supplied, a typical exhaust gas is formed and discharged in each flow cycle through the reaction zone, which has a composition of 55% to 75% methane ($CH_4$) and 24% to 44% hydrogen ($H_2$).

In an advantageous embodiment of the invention, an exhaust gas of this type is reprocessed in a cycle process, for example in a methanization plant in which the hydrogen fraction is reprocessed to methane using carbon dioxide ($CO_2$) and/or carbon monoxide (CO), which is returned into the inlet side of the reaction zone for a new infiltration cycle together with the discharged methane and fresh methane.

The carbon dioxide and the carbon monoxide may, for example, even come from other exhaust gas sources, so that they can be recycled in the manner according to the invention for reprocessing the exhaust gas of the infiltration plant. For this purpose, an excess quantity of especially hydrogen, preferably also water, may be used in the methanization plant.

Therefore, the method of depositing carbon according to the invention is preferably carried out using a gas supplied into the reaction zone, which contains greater than or equal to 94% methane and up to 6% hydrogen.

The need of fresh gas, in other words the need of methane which is, for example, supplied from a liquid gas tank (LNG tank), can be reduced to up to 20% by reprocessing the exhaust gas from the reactor according to the invention. Thereby, the need of fresh methane is reduced. In addition, the method according to the invention allows, for example, the environment-friendly processing of carbon dioxide ($CO_2$).

Accordingly, the method according to the invention may be configured as a cycle process for depositing refractory substances other than carbon in case of other precursors than methane as well, by reprocessing the byproduct released during the reaction of the precursor together with the excessive precursor, and by returning it into the inlet of the reactor.

Further advantages, features and details of the invention will arise from the following description of preferred exemplary embodiments of the invention and from the Figures of the drawing, which are to be considered as part of the description.

DETAILED DESCRIPTION OF THE INVENTION

Figure 1:
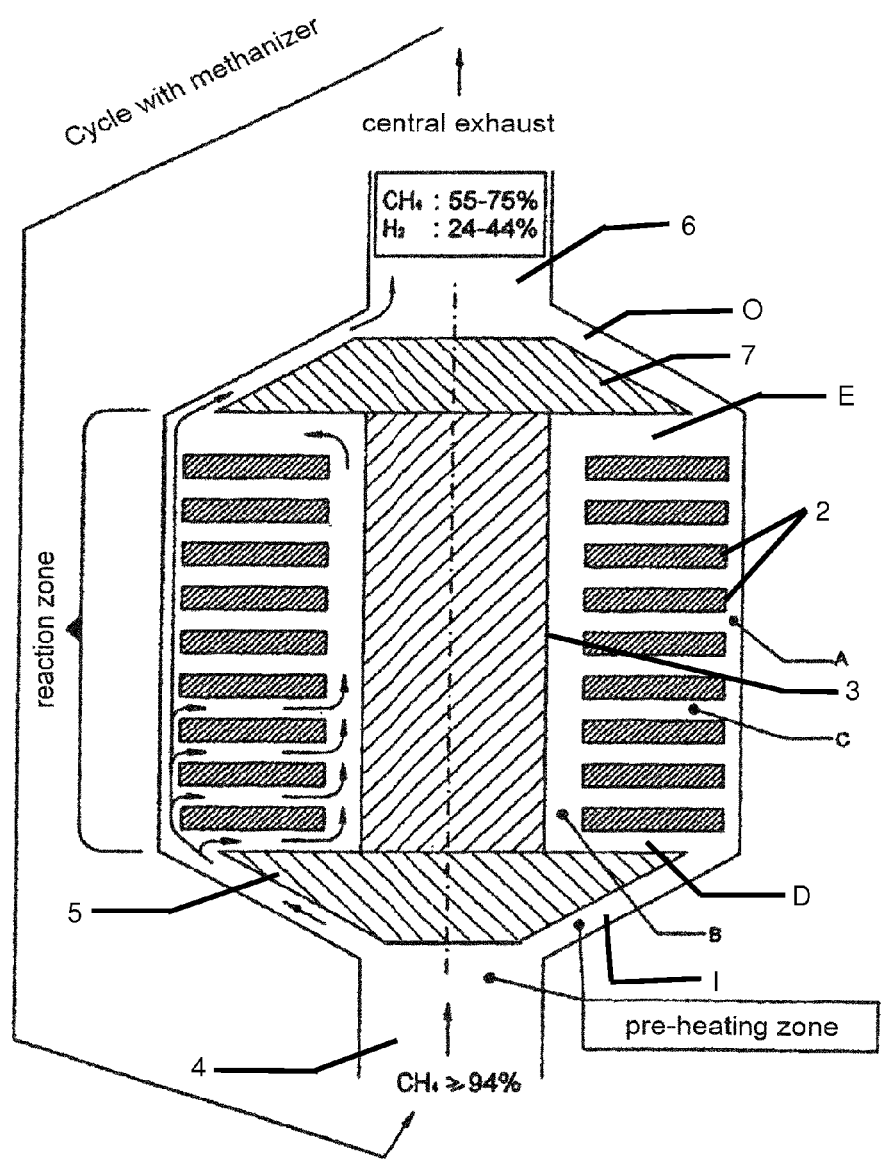
FIG. 1 shows a schematic drawing of a longitudinal section through a reactor for carrying out a method according to the invention according to a first exemplary embodiment.

FIG. 1 shows a schematic drawing of a longitudinal section through a reactor for carrying out the method according to the invention. In a reactor vessel having a vessel wall 1, a plurality of ring-shaped layers 2 of sample bodies are arranged one upon the other in a vertical stack axially and concentrically and spaced apart, and are defined concentrically, radially to the stack by vertical and in cross-section ring-shaped circumferential gaps (A, B) of a radially outer circumferential gap (A) and a radially inner circumferential gap (B). Each circumferential gap (A, B) has a constant gap width in the circumferential direction of the stack and in a vertical direction. The radially outer circumferential gap (A) is defined along its radially outer circumference by the vessel wall (1) and is open at its longitudinal ends toward the inlet side and toward the outlet side of the reaction zone. A core (3) is disposed in the central inner space of the stack of ring-shaped layers (2), by which the radially inner circumferential gap (B) is defined along its radially inner circumference. The radially inner circumferential gap (B) is closed at its longitudinal ends toward the inlet side and toward the outlet side of the reaction zone. Transverse gaps C having constant and among each other equal gap widths ending in the circumferential gaps (A, B) in an open manner in a radial direction of the stack, which extend in a transverse direction and according to FIG. 1 perpendicularly to the circumferential gaps (A, B) are formed by the gaps between respectively successive layers. The interior space of the reactor and the stack of ring-shaped layers are preferably configured to be cylindrical.

The reaction gas which is introduced centrally into the reactor vessel and is discharged centrally from the reactor vessel flows axially—in a vertical direction—through the interior space of the reactor vessel (1).

A preferably truncated inlet baffle cone (5) is provided between a central inlet (4) and an axial front face—in FIG. 1 the lower one—of the sample body stack, the diameter of which increases axially toward the reaction space receiving the stack in the interior space of the reactor, and is surrounded by an inlet ring gap (I) between the lateral surface of the baffle cone and a correspondingly hollow cone-shaped portion of the reactor wall (1), so that the inflow is led into the radially outer circumferential gap (A). Preferably, the inlet ring gap has at least at its aperture into the outer gap a gap width that corresponds to that of the radially outer circumferential gap (A).

The radially inner circumferential gap (B) is axially closed on the inlet side of the reaction space by the base of the baffle cone (5), wherein, however, an inlet side transverse end gap (D) corresponding to the transverse gaps (C) in their gap width remains between the layer (2) located the most adjacent to the inlet and the base of the baffle cone (5).

An outlet baffle cone (7) is, for example, provided between the other, in FIG. 1 the upper axial front face of the stack and a central gas outlet (6) within a flow-guiding hollow cone-shaped portion of the reactor wall 1, which is, for example, also truncated and the diameter of which decreases axially towards the gas outlet (6) and is enclosed by an outlet ring gap (O) between the conical outer surface of the baffle cone (7) and the hollow cone-shaped portion of the reactor wall. The gap width of the outlet ring gap (O) may also correspond to the gap width of the radially outer circumferential gap (A), but is, for example, slightly greater than the gap width of the radially outer circumferential gap (A).

The radially inner circumferential gap (B) is closed in its vertical longitudinal direction on the outlet side of the reaction space by the base of the outlet baffle cone (7) or, in case that there is none, by a mounted transverse plate or the like, wherein, however, a transverse outlet side end gap (E) remains between the layer (2) of the stack, which is the most adjacent to the outlet side of the reaction zone, and the base of the baffle cone (7). This transverse end gap (E) corresponds to the transverse gaps (C), wherein, however, its gap width is greater than the gap width of the transverse gap (C). Preferably, the gap width of the outlet ring gap (O) corresponds to the gap width of the outlet side end gap (E).

The ratio of the gap widths of the radially inner circumferential gap (B) to the radially outer circumferential gap (A) is greater than 1 and equal to or less than 20 according to the invention. The ratio of the gap widths of each transverse gap (C) to the radially outer circumferential gap (A) is in the range of 0.25 to 12 according to the invention. The above-mentioned gap width ratios (B) to (A) and (C) to (A) are preferably chosen so that the ratio of the gap width of the radially inner transverse gap (B) to the gap width of each of the transverse gaps (C) is greater than 1 and equal to or less than 10, preferably greater than 1 and equal to or less than 5. Within these ranges, the gap widths may be varied, preferably a total ratio range A:B:C of 1:2:0.5 to 1:10:5 being applied. The ratio of the gap width of the outlet side end gap (E) to the gap width of the transverse gaps (C) is preferably in the range of 1.5 to 2.5.

The reaction zone formed between the baffle cones is heated to the reaction temperature when the reactor is operated. Besides, the inlet side baffle cone (5) is heated, so that the gas entering through the gas inlet (4) is preheated in the inlet ring gap along a comparatively large heating surface along the inlet baffle cone (5), without, however, achieving the activation temperature of the precursor gas flowing therethrough.

The reactor schematically shown in FIG. 1 is preferably flown through bottom-up. It is, however, also possible to configure the reactor for a reversed flow top down. In this case, the reactor is rotated 180° when compared to the view in FIG. 1, so that the gas inlet 4 is arranged at the top and the gas outlet 6 is arranged at the bottom.

In addition, the method according to the invention may be provided as a cycle process for the deposition of carbon, as schematically shown in FIG. 1, wherein a methanization plant—also referred to as methanizer—is inserted for regenerating the methane ($CH_4$) used as a precursor from the exhaust gas of the reactor. This will be explained later with reference to FIG. 3.

Figure 2:
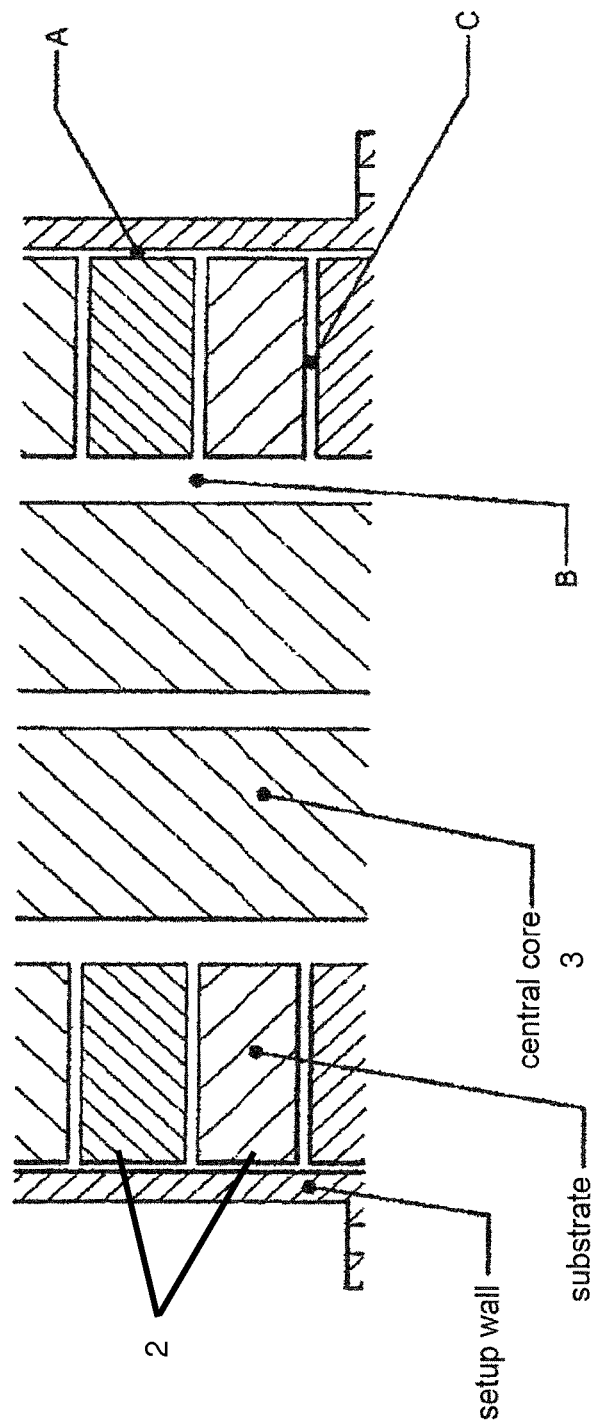
FIG. 2 shows a schematic drawing of a stack arrangement and of gap ratios according to the invention.

FIG. 2 shows in a cross-sectional detail of FIG. 1 a reactor wall (1) referred to as setup wall, into which the stack of the porous structures to be infiltrated is inserted, by which the layers (2) of the stack are formed. The central core (3) limiting the radially inner ring-shaped circumferential gap (B) radially inside may, in addition, serve to fix the porous structures. For this purpose, graphite pins may, for example, be arranged at the central core, which hold the porous structure. It is also possible to provide other or additional fixtures, for example made of another material. The corresponding fixture may be adapted to the respective sample body as to its shape, material and size. In the schematic diagram in FIG. 2, these pins are not shown in order to simplify the graphic. The sample bodies are stacked equidistantly one upon the other. In this connection, the gap distance of the transverse gap (C) is always constant in the present exemplary embodiment. A radially outer circumferential gap (A) is formed between the reactor wall (1) and the radially outer edge of the layers (2), which is constant as to its gap width. In addition, there is also the radially inner circumferential gap (B) between the central core (2) and the radially inner edge of the sample bodies. The gap width of this radially inner circumferential gap (B) is related to the respective size of the sample bodies and is constant for a given sample body.

The gap width of the radially outer circumferential gap is chosen to be sufficiently narrow, so that the transverse flows of the gas in and through the transverse gaps are achieved across the height of the stack, in particular also in the upper region of the stack, without the main amount of gas flowing past the radially outer ends of the transverse gaps without branching into the transverse gaps. Since the gap width of the radially inner circumferential gap (B) is greater, for example 2 to 5 times greater than the gap width of the radially outer circumferential gap (A), the branching flows are additionally driven by the transverse gaps, though. For a pressure range of 100 mbar to 300 mbar, a maximum gap width of the radially outer circumferential gap of 8 mm has turned out to be advantageous in the established diameter range of brake disks and sample bodies of that sort, while a respectively greater gap width of the circumferential gap (A) is advantageous in case of lower pressures.

The gap width of the transverse gaps (C) is determined as a function of the size of the respective sample body and/or the aspired homogeneity and/or a desired target density of the respective refractory substance.

For example, the transverse gap (C) can be determined according to the ratio of the radial length to the thickness of the sample body. In this case, for example, a transverse gap (C) with a greater gap width is to be chosen in order to achieve a specific target density, if the ratio of radial length to thickness of the sample body is great, and, inversely, a smaller gap width is to be chosen, if the ratio of radial length to thickness is small.

Figure 3:
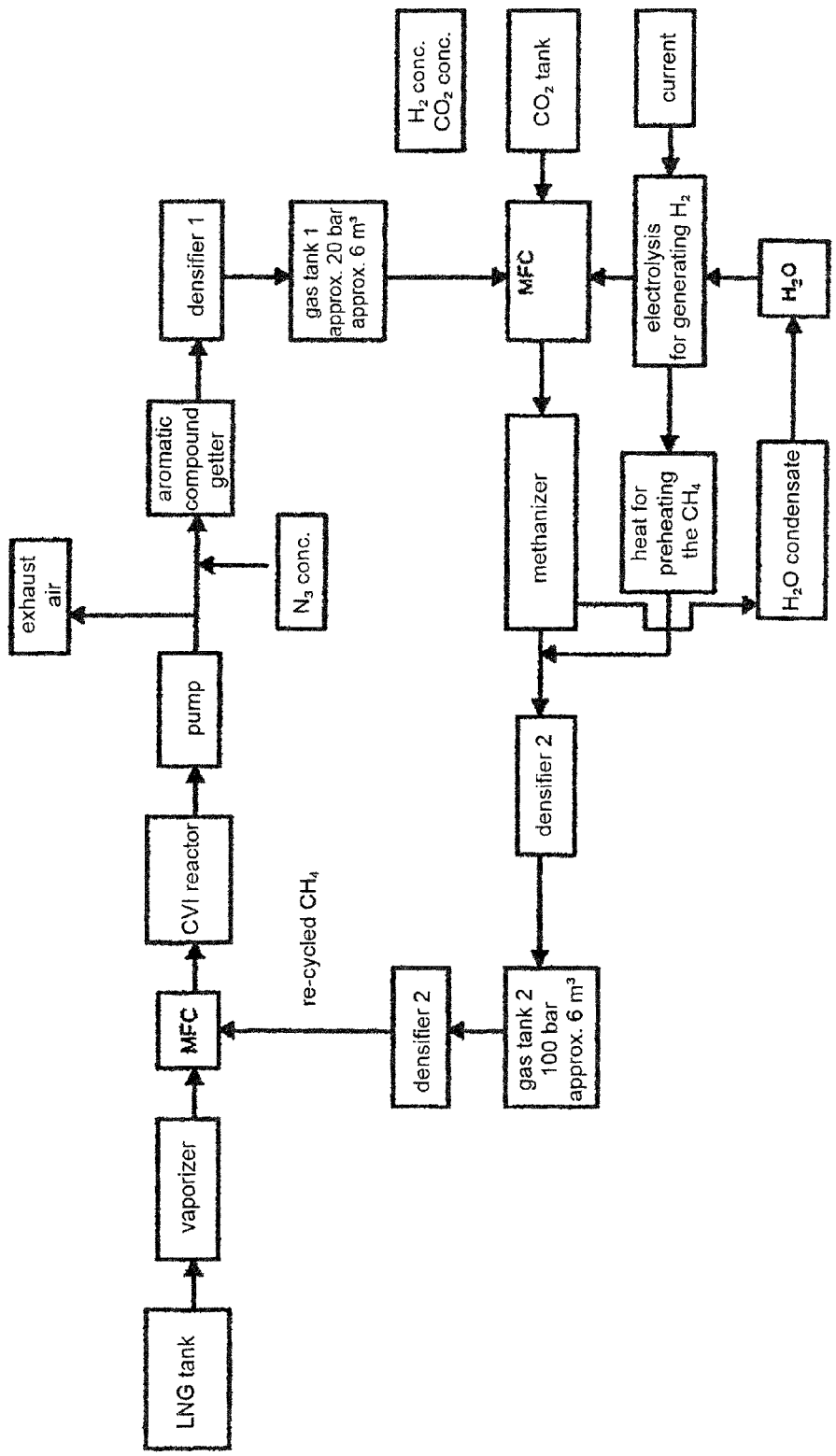
FIG. 3 shows a basic diagram of a method according to the invention according to another exemplary embodiment, wherein an exhaust gas is reprocessed, for example, by means of a methanization plant.

FIG. 3 shows a schematic view of a method according to the invention according to another exemplary embodiment, wherein, in the case of a deposition of carbon, the exhaust gas from the reaction zone of the reactor is reprocessed in and by means of a methanization plant. The structure of the plant is illustrated by the description of the component parts according to FIG. 3 as well as by the drawn arrows. Methane is extracted from a liquid gas tank (or also an LNG tank) for the reaction in the CVI reactor according to the invention.

The exhaust gas according to the method is, for example, composed of:
- approx. 63% unused methane,
- approx. 32% hydrogen,
- the rest being water and potentially containing other hydrocarbons.

First, the hydrogen fraction of the exhaust gas is measured. Accordingly, carbon dioxide ($CO_2$) and/or carbon monoxide (CO) is added, in order to form regenerated methane in the methanization plant from the hydrogen present in the exhaust gas, which is released in the reactor as a byproduct when reacting the methane. Thus, for example approximately 10% or more regained methane can be returned into the cycle process together with the unreacted methane. The other between 25% and 30% methane are fed from the liquid gas tank.

Thus, in order to be widely independent from external methane supplies, carbon monoxide CO or carbon dioxide $CO_2$ may additionally be supplied. Thereby, the fraction of hydrogen ($H_2$) of the exhaust gas reacted to methane is already significantly increased. Most advantageously, additional hydrogen ($H_2$) may be supplied, so that the reaction of hydrogen ($H_2$) included in the exhaust gas and, for example, supplied carbon dioxide ($CO_2$) or carbon monoxide (CO) is additionally optimized, whereby the yield of methane ($CH_4$) as a gaseous precursor which can be supplied to the cycle process is additionally optimized.

The additional hydrogen may, for example, be obtained by electrolysis from water ($H_2O$). Water vapor contained in exhaust gas advantageously cleans the catalyzer of the methanization plant. With respect to the suitable catalyzers, a plurality of different catalyzers may be used, such as nickel-based catalyzers or, for example, also noble metals, such as Pt, Pd.

Second Exemplary Embodiment

The method according to the invention is described by way of example using carbon deposition as an example; in this respect, reference is made to EP 0 946 459 B1 with respect to the details of the deposition reaction of carbon from methane as a gaseous precursor as well as exemplary reaction parameters.

The porous structures or sample bodies are, preferably on all sides, subjected to a flow of a gas containing at least one gaseous precursor in a reaction zone. In this respect, the circumferential gaps (A) and (B), respectively, and transverse gaps (C) arranged on and around the sample body each have the gap width ratios discussed above.

The gas, for example natural gas, containing at least one gaseous precursor, in this case methane ($CH_4$) as the substantially only precursor, is preheated and thus thermally excited in a preheating zone of the reactor, for example in the inlet ring gap I shown in FIG. 1 along the inlet baffle cone (5).

However, the preheating occurs only to such a degree that no disintegration of the methane and thus no formation of radicals occurs. Then, the activated gas flows through the gaps around the sample bodies.

The chemical vapor infiltration of carbon (C) may, for example, be carried out using technically pure methane. Reaction temperature, reaction pressure and flow rate are set in such a way that first a diffusion of the methane ($CH_4$) into the pores of the sample body takes place prior to the abreaction of the gaseous precursor methane ($CH_4$). An increased formation of radicals and thus the deposition of the carbon resulting therefrom in the pores of the porous sample bodies only occur in the pores of the porous sample bodies. Hydrogen ($H_2$) is formed during the reaction, which escapes from the sample body by back-diffusion. The concentration gradient between the surface of the sample body and its interior is increased by this process, which results in an accelerated diffusion of more methane into the sample body.

FIG. 1 and FIG. 2 show that the sample bodies are surrounded by different gaps. These gaps are not always identical but are adapted to the respective dwell time of the gas at the location of the reaction. In this connection, the gas dwell times in the circumferential gaps (A) and (B) are almost identical. The gas dwell time in the transverse gap (C) is set in such a manner that a densification of the sample bodies as homogeneous as possible is ensured. The arrangement of the gaps with respect to the sample bodies is, in other words, both in parallel (gaps (A) and (B)) and transverse (gap (C)) to the main flow direction through the reactor.

The gas guidance in the reactor is such that the gas containing the gaseous precursor flows into the preheating zone at the gas inlet (4) and into the inlet ring gap (I) of the reactor. From there, the gas flows along the outer circumference of the sample body stack (circumferential gap (A)), is branched from there and distributed into the transverse gaps (C), and flows to the inner circumferential gap (B). From the radially inner circumferential gap, the gas can flow off in the outlet ring gap 0 through the outlet side end gap (E) which at the outlet side end of the radially outer circumferential gap opens therein. The gas can flow through the reactor bottom-up or top down. In the latter case, the reactor from FIG. 1 is turned 180°, so that the gas inlet 4 and the gas outlet 6 are interchanged.

A corresponding adaptation of the gap width of the transverse gaps (C) allows to achieve a desired target density for the sample bodies used. For example, the following target densities could be achieved with a chemical vapor infiltration according to the invention of carbon in a ring-shaped disk having an outer diameter of 390 mm and an inner diameter of 158 mm with a constant ratio of the gap width of the radially inner circumferential gap (B) to the gap width of the radially outer circumferential gap (A) by changing the ratio (B:C) of the gap width of the radially inner circumferential gap (B) to the gap width of each of the transverse gaps (C):

| Target density | Gap ratio (B):(C) |
| --- | --- |
| >1.6 g/ccm | 3.5 to 4 |
| 1.3 g/ccm | 2.4 to 2.8 |
| 1.0 g/ccm | 1.7 to 2.0 |
| <1.0 g/ccm | 1.2 to 1.5 |

The hydrogen ($H_2$) generated in the reaction leads to a local dilution of the methane concentration, but due to the targeted exhaustion, it is quickly discharged from the reaction location. Due to the fact that methane present in the system is provided in considerable excess, this excess and thus the saturation adsorption condition is maintained despite the quantities of hydrogen.

The main component parts of the exhaust gas according to the invention are approximately 63% methane and approximately 32% hydrogen in the exemplary embodiment.

The exhaust gas may preferably be converted into electricity by means of a block heat and power plant.

Alternatively, the hydrogen ($H_2$) present in the exhaust gas may, as schematically shown by FIG. 3, be made usable again for a CVI method, for example by means of a methanization plant in the manner as already described above, namely by re-converting the hydrogen ($H_2$) to methane ($CH_4$) by reaction, for example with carbon dioxide ($CO_2$) and/or also carbon monoxide (CO). For a further optimization, it is also possible according to the invention to additionally supply hydrogen as well as water, in order to react the for example supplied carbon dioxide ($CO_2$) and/or also the for example supplied carbon monoxide (CO) in an optimized manner and, for example, to additionally make up for losses occurring during the reaction of the hydrogen ($H_2$) of the exhaust gas with the supplied carbon dioxide to methane by water ($H_2O$) produced as a byproduct. The method according to the invention can therefore be operated in a particularly advantageous manner as a cycle process. In this case, the methane ($CH_4$) gained from the hydrogen ($H_2$) of the exhaust gas is re-fed to the method according to the invention as a gaseous precursor.

The realization of the method according to the invention as a cycle process using a methanization plant is, for example, shown schematically in FIG. 3.

FIG. 3 schematically shows the processing of the exhaust gas according to the method composed of approx. 63% methane ($CH_4$) and approx. 34% hydrogen ($H_2$) by means of a methanization plant. The reaction yielded a gas mixture of approximately 95% methane ($CH_4$) and approximately 4% hydrogen ($H_2$). This gas mixture contains a sufficient amount of methane ($CH_4$) as a gaseous precursor and can therefore be re-fed to the method according to the invention as a gas containing a gaseous precursor. The low hydrogen fraction ($H_2$) does not have a noticeable influence on the chemical vapor infiltration of carbon according to the invention. In this type of recovery, only a maximum of 30% of "fresh natural gas" (methane) have to be added in each case, which is why it is particularly advantageous, as it allows to save a great amount of fresh gas containing a gaseous precursor—for example natural gas. Hence, the hydrogen contained in the exhaust gas according to the method is recycled in a particularly advantageous manner using for example carbon dioxide ($CO_2$) and/or carbon monoxide (CO). $CO_2$ accumulated for example during combustion processes may thereby be used up in an environment-friendly way.

The hydrogen ($H_2$) supplied in addition, for example in a volume ratio of methane or natural gas and added hydrogen ($H_2$) of 20:1 to 2:1, for example of 10:1 to 5:1, can be obtained in an advantageous manner by means of electrolysis—for example from water ($H_2O$).

The temperature range for the chemical vapor infiltration is preferably in a temperature range of 1,000° C. to 1,200° C. for carbon.

What is claimed is:

1. Method for chemical vapor infiltration of at least one refractory substance, in which method a porous structure is subjected in a reaction zone, which is heated to a predetermined reaction temperature, to the flow of a gas containing at least one gaseous precursor forming a solid phase by deposition reaction, wherein the partial pressure of the gaseous precursor and the dwell time of the gas while passing through the reaction zone are set at the predetermined reaction temperature in the reaction zone in such a manner, that a deposition reaction of the precursor occurs in the partial pressure range of saturation adsorption, and that
the deposition reaction of the gaseous precursor is limited in each stage of the infiltration in such a manner that no more than 50% of the gaseous precursor supplied in the gas are reacted for deposition of the solid phase in the porous structure while the gas is passing through the reaction zone,
wherein the porous structure is exposed to the flow in ring-shaped layers of at least one vertical stack of the superimposed ring-shaped layers, the stack being arranged in a vertical direction between an inlet side and an outlet side of the reaction zone, through vertical circumferential gaps (A, B) of a ring-shaped radially outer circumferential gap (A), defined at an inner circumference thereof by the radially outer sides of the layers and at an outer circumference thereof by a radially inner side of a reactor wall, and a ring-shaped radially inner circumferential gap (B), defined at an inner circumference thereof by a radially outer side of a central core of the stack and at an outer circumference thereof by the radially inner sides of the layers, as well as through transverse gaps (C) extending between the layers transverse to the vertical direction and through transverse inlet side and outlet side end gaps (D, E) each extending between the inlet side and the outlet side of the reaction zone and the respective neighboring layer of the stack, wherein each of the transverse gaps and each of the end gaps are open towards both of the circumferential gaps (A, B), and each of the circumferential gaps has a gap width between said inner and outer circumferences thereof that is constant between the transverse gaps at least in a circumferential direction of the stack, wherein said gaps are arranged in such a manner that inlet side and outlet side ends of the outer circumferential gap are vertically open towards the inlet side and towards the outlet side of the reaction zone, and inlet side and outlet side ends of the inner circumferential gap are vertically closed towards the inlet side and towards the outlet side of the reaction zone, and the ratio of the gap width of the radially inner circumferential gap (B) to the gap width of the radially outer circumferential gap (A) is greater than 1 and at most 20, and the ratio of a gap width of each of the transverse gaps (C) to the gap width of the radially outer circumferential gap is 0.25 to 12, so that the layers of the stack are subjected to branch flows of the gas from the outer circumferential gap (A) through the transverse gaps (C) and into the inner circumferential gap (B), and gas from the inner circumferential gap (B) flows out through the outlet side end gap (E).

2. Method according to claim 1, wherein the ratio of the gap width of the radially inner circumferential gap (B) to the gap width of the radially outer gap width (A) is set in a range of 2 to 10.

3. Method according to claim 1, wherein the ratio of the gap width of each of the transverse gaps (C) to the gap width of the radially outer circumferential gap (A) is set in a range of 0.5 to 10.

4. Method according to claim 1, wherein the ratio of the gap width of the radially inner circumferential gap (B) to the gap width of each of the transverse gaps (C) is set in a range between 1 and 5.

5. Method according to claim 1, wherein a total gap width ratio (A:B:C) of the gap width of the radially outer circumferential gap (A) to the gap width of the radially inner circumferential gap (B) to the gap width of each of the transverse gaps (C) is set in a range of 1:2:0.5 to 1:10:5.

6. Method according to claim 1, wherein the outlet side end gap (E) is set to have a gap width that is greater than the gap width of each of the transverse gaps (C), and an outer side of the outlet side layer of the stack is subjected to a gas flow from the inner circumferential gap through the outlet side end gap.

7. Method according to claim 6, wherein the ratio of the gap width of the outlet side end gap (E) to the gap width of each of the transverse gaps (C) is set to be in a range of 1.5 to 2.5.

8. Method according to claim 1, wherein the gas containing at least one precursor is supplied to the radially outer circumferential gap (A) through an inlet ring gap (I) having a diameter that gradually increases from a central gas inlet toward the radially outer circumferential gap (A), and an exhaust gas is discharged from the radially outer circumferential gap (A) through an outlet ring gap (O) having a diameter that gradually decreases from the radially outer circumferential gap (A) toward a central outlet.

9. Method according to claim 8, wherein the gas containing at least one gaseous precursor is preheated in the inlet ring gap (F).

10. Method according to claim 1, wherein the exposure of the porous structure to the gas flow occurs in several stacks of the same type arranged next to each other, wherein each of the stacks is surrounded by a reactor wall by which the outer circumference of the ring-shaped outer circumferential gap (A) of said each of the stacks is defined.

11. Method according to claim 1, which is carried out as a cycle process, wherein an exhaust gas composed of the byproduct released during the limited reaction of the precursor gas and the unreacted fraction of the precursor gas is drawn off from the reaction zone into a processing plant in which the byproduct is reprocessed to regenerated precursor gas and the exhaust gas reprocessed in such a manner is returned into the reaction zone.

12. Method according to any one of claims 1 to 11, which is used for vapor infiltration of carbon (C) by reacting methane ($CH_4$) at a reaction temperature in a temperature range of 900° C. to 1,200° C. at a pressure of 50 mbar to 300 mbar, the dwell time of the gas while passing through the reaction zone being set to be in a range of 0.01 second to 1 second.

13. Method according to claim 12, wherein an exhaust gas is discharged from the reaction zone which predominantly contains methane and hydrogen, and is led into a methanization plant in which the hydrogen ($H_2$) is processed to methane ($CH_4$), which is returned into the reaction zone together with methane discharged from the reaction zone and with fresh methane.

14. Method according to claim 13, wherein an exhaust gas composed of methane ($CH_4$) and hydrogen ($H_2$) is discharged from the reaction zone, containing 55% to 75% methane ($CH_4$) and 24% to 44% hydrogen ($H_2$).

15. Method according to claim 13, wherein the hydrogen is processed by its reaction with carbon dioxide ($CO_2$) and/or carbon monoxide (CO).

16. Method according to claim 13, wherein hydrogen ($H_2$) and water ($H_2O$) are additionally supplied to the exhaust gas in the methanization plant.

17. Method according to claim 13, wherein the gas returned into the reaction zone contains at least 94% methane ($CH_4$) and up to 6% hydrogen ($H_2$).

18. Method according to claim 1, wherein the ratio of the gap width of the radially inner circumferential gap (B) to the gap width of the radially outer circumferential gap (A) is set to be in a range of 2 to 10, and wherein the ratio of the gap width of each of the transverse gaps (C) to the gap width of the radially outer circumferential gap (A) is set to be in a range of 0.5 to 10.

19. Method according to claim 1, wherein the ratio of the gap width of the radially inner circumferential gap (B) to the gap width of the radially outer circumferential gap (A) is set to be in a range of 2 to 10, and wherein the ratio of the gap width of the radially inner circumferential gap (B) to the gap width of each of the transverse gaps (C) is set to be in a range between 1 and 5.

20. Method for chemical vapor infiltration of at least one refractory substance, in which method a porous structure is subjected in a reaction zone, which is heated to a predetermined reaction temperature, to the flow of a gas containing at least one gaseous precursor forming a solid phase by deposition reaction, wherein the partial pressure of the at least one gaseous precursor and the dwell time of the gas while passing through the reaction zone are set at the predetermined reaction temperature in the reaction zone in such a manner, that a deposition reaction of the precursor occurs, wherein the porous structure is exposed to the flow in ring-shaped layers of at least one vertical stack of the superimposed ring-shaped layers, the stack being arranged in a vertical direction between an inlet side and an outlet side of the reaction zone, through vertical circumferential gaps (A, B) of a ring-shaped radially outer circumferential gap (A), defined between the radially outer sides of the layers and a radially inner side of a reactor wall, and a ring-shaped radially inner circumferential gap (B), defined between a radially outer side of a central core of the stack and the radially inner sides of the layers, as well as through transverse gaps (C) each extending between the layers transverse to the vertical direction and through transverse end gaps (D, E) each extending between the inlet side and the outlet side of the reaction zone and the respective neighboring layer of the stack, wherein the transverse gaps and the end gaps are each open towards both of the circumferential gaps (A, B), and each of the circumferential gaps has a gap width between said inner and outer circumferences thereof that is constant between the transverse gaps at least in a circumferential direction of the stack, wherein said gaps are arranged in such a manner that inlet side and outlet side ends of the outer circumferential gap are vertically open towards the inlet side and towards the outlet side of the reaction zone, and inlet side and outlet side ends of the inner circumferential gap are vertically closed towards the inlet side and towards the outlet side of the reaction zone, and the ratio of the gap width of the radially inner circumferential gap (B) to the gap width of the radially outer circumferential gap (A) is greater than 1 and at most 20, and the ratio of the gap width of each of the transverse gaps (C) to the radially outer circumferential gap is 0.25 to 12.

21. Method according to claim 1, wherein the ratio of the gap width of each of the transverse gaps (C) to the gap width of the radially outer circumferential gap (A) is set to be in a range of 0.5 to 5.

22. Method according to claim 1, wherein the ratio of the gap width of the radially inner circumferential gap (B) to the gap width of the radially outer circumferential gap (A) is set in a range of 2 to 10, and wherein the ratio of the gap width of each of the transverse gaps (C) to the gap width of the radially outer circumferential gap (A) is set in a range of 0.5 to 5.

23. Method for chemical vapor infiltration of carbon, in which method a porous structure is subjected in a reaction zone to the flow of a gas containing methane forming a solid phase of the carbon by deposition reaction, wherein the reaction zone is heated to a temperature in a range of 900° C. to 1,200° C. and the pressure of the gas is set in the reaction zone in a range of 50 to 300 mbar and the dwell time of the gas in the reaction zone per passage of the flow through the reaction zone is set in a range of 0.01 seconds to 1 second in such a manner, that the methane is reacted by 10% to 30% in each flow passage through the reaction zone, wherein the porous structure is exposed to the flow in ring-shaped layers of at least one vertical stack of the superimposed ring-shaped layers, the stack being arranged in a vertical direction between an inlet side and an outlet side of the reaction zone, through vertical circumferential gaps (A, B) of a ring-shaped radially outer circumferential gap (A), defined at an inner circumference thereof by the radially outer sides of the layers and at an outer circumference thereof by a radially inner side of a reactor wall, and a ring-shaped radially inner circumferential gap (B), defined at an inner circumference thereof by a radially outer side a central core of the stack and at an outer circumference thereof by the radially inner sides of the layers, as well as through transverse gaps (C) extending between the layers transverse to the vertical direction and through transverse end gaps (D, E) each extending between the inlet side and the outlet side of the reaction zone and the respective neighboring layer of the stack, wherein each of the transverse gaps and each of the end gaps are open towards both of the circumferential gaps (A, B), and each of the circumferential gaps has a gap width between the inner and outer circumferences thereof that is constant between the transverse gaps at least in a circumferential direction of the stack, wherein said gaps are arranged in such a manner that inlet side and outlet side ends of the outer circumferential gap are vertically open towards the inlet side and towards the outlet side of the reaction zone, and inlet side and outlet side ends of the inner circumferential gap are vertically closed towards the inlet side and towards the outlet side of the reaction zone, and the ratio of the gap width of the radially inner circumferential gap (B) to the gap width of the radially outer circumferential gap (A) is greater than 1 and at most 20, and the ratio of the gap width of each of the transverse gaps (C) to the radially outer circumferential gap is 0.25 to 12, so that the layers of the stack are subjected to a branch flows of the gas from the outer circumferential gap through the transverse gaps and into the inner circumferential gap, and gas from the inner circumferential gap flows out through the outlet side end gap.

24. Method according to claim 23, wherein the ratio of the gap width of the radially inner circumferential gap (B) to the gap width of the radially outer circumferential gap (A) is set in a range of 2 to 10.

25. Method according to claim 23, wherein the ratio of the gap width of each of the transverse gaps (C) to the gap width of the radially outer circumferential gap (A) is set in a range of 0.5 to 10.

26. Method according to claim 23, wherein the ratio of the gap width of the radially inner circumferential gap (B) to the gap width of the transverse gaps (C) is set in a range between 1 and 5.

27. Method according to claim 23, wherein a total gap width ratio (A:B:C) of the gap width of the radially outer circumferential gap (A) to the gap width of the radially inner circumferential gap (B) to the gap width of each of the transverse gaps (C) is set in a range of 1:2:0.5 to 1:10:5.

28. Method according to claim 23, wherein the outlet side end gap (E) is set to have a gap width that is greater than the gap width of each of the transverse gaps (C), and an outer side of the outlet side layer of the stack is subjected to a gas flow from the inner circumferential gap through the outlet side end gap.

29. Method according to claim 28, wherein the ratio of the gap width of the outlet side end gap (E) to the gap width of each of the transverse gaps (C) is set to be in a range of 1.5 to 2.5.

30. Method according to claim 23, wherein the gas containing methane is supplied to the radially outer circumferential gap (A) through an inlet ring gap (I) having a diameter that gradually increases from a central gas inlet toward the radially outer circumferential gap (A) and an exhaust gas is discharged from the radially outer circumferential gap (A) through an outlet ring gap (O) having a diameter that gradually decreases from the radially outer circumferential gap (A) toward a central outlet.

31. Method according to claim 30, wherein the gas containing methane is preheated in the inlet ring gap (F).

32. Method according to claim 23, wherein the exposure of the porous structure to the gas flow occurs in several stacks of the same type arranged next to each other, wherein each of the stacks is surrounded by a reactor wall by which the outer circumference of the ring-shaped outer circumferential gap (A) of said each of the stacks is defined.

33. Method according to claim 23, which is carried out as a cycle process, wherein an exhaust gas composed of the byproduct released during the limited reaction of the methane gas and the unreacted fraction of the methane gas is drawn off from the reaction zone into a processing plant in which the byproduct is reprocessed to regenerated methane gas and the exhaust gas reprocessed in such a manner is returned into the reaction zone.

34. Method according to claim 33, wherein an exhaust gas is discharged from the reaction zone which predominantly contains methane and hydrogen, and is led into a methanization plant in which the hydrogen ($H_2$) is processed to methane ($CH_4$), which is returned into the reaction zone together with methane discharged from the reaction zone and with fresh methane.

35. Method according to claim 34, wherein an exhaust gas composed of methane ($CH_4$) and hydrogen ($H_2$) is discharged from the reaction zone, containing 55% to 75% methane ($CH_4$) and 24% to 44% hydrogen ($H_2$).

36. Method according to claim 34, wherein the hydrogen is processed by its reaction with carbon dioxide ($CO_2$) and/or carbon monoxide (CO).

37. Method according to claim 34, wherein hydrogen ($H_2$) and water ($H_2O$) are additionally supplied to the exhaust gas in the methanization plant.

38. Method according to claim 34, wherein the gas returned into the reaction zone contains at least 94% methane ($CH_4$) and up to 6% hydrogen ($H_2$).

39. Method according to claim 23, wherein the ratio of the gap width of the radially inner circumferential gap (B) to the gap width of the radially outer circumferential gap (A) is set to be in a range of 2 to 10, and wherein the ratio of the gap width of each of the transverse gaps (C) to the gap width of the radially outer circumferential gap (A) is set to be in a range of 0.5 to 10.

40. Method according to claim 23, wherein the ratio of the gap width of the radially inner circumferential gap (B) to the gap width of the radially outer gap (A) is set to be in a range of 2 to 10, and wherein the ratio of the gap width of the radially inner circumferential gap (B) to the gap width of each of the transverse gaps (C) is set to be in a range between 1 and 5.

41. Method according to claim 22, wherein the ratio of the gap width of each of the transverse gaps (C) to the gap width of the radially outer circumferential gap (A) is set to be in a range of 0.5 to 5.

42. Method according to claim 23, wherein the ratio of the gap width of the radially inner circumferential gap (B) to the gap width of the radially outer circumferential gap (A) is set in a range of 2 to 10, and wherein the ratio of the gap width of each of the transverse gaps (C) to the gap width of the radially outer circumferential gap (A) is set in a range of 0.5 to 5.

* * * * *